United States Patent [19]
Zimmermann et al.

[11] Patent Number: 5,211,759
[45] Date of Patent: May 18, 1993

[54] METHOD FOR A DOUBLESIDED COATING OF OPTICAL SUBSTRATES

[75] Inventors: Heinrich Zimmermann, Buchs; Mauro Zucchi, Azmoos, both of Switzerland

[73] Assignee: Balzers Aktiengesellschaft, Liechtenstein

[21] Appl. No.: 841,721

[22] Filed: Feb. 26, 1992

[30] Foreign Application Priority Data
Mar. 5, 1991 [CH] Switzerland .................... 659/91

[51] Int. Cl.$^5$ .................................... C23C 16/48
[52] U.S. Cl. ............................ 118/723; 118/730
[58] Field of Search ............................ 118/723, 730

[56] References Cited
U.S. PATENT DOCUMENTS

| | | |
|---|---|---|
| 2,397,207 | 3/1946 | Sachtleben ..................... 118/723 |
| 3,713,869 | 1/1973 | Geffcken et al. .................. 427/489 |

FOREIGN PATENT DOCUMENTS
2263480 8/1973 Fed. Rep. of Germany .

Primary Examiner—Richard Bueker
Attorney, Agent, or Firm—Notaro & Michalos

[57] ABSTRACT

To reach a better production sequence and an increased quality for plasma polymerization coatings and evaporation coatings on both sides of optical lenses, it is suggested to proceed with the deposition of the layers within an especially suitable apparatus configuration where the plasma polymerization coating is deposited simultaneously on both sides of the lenses.

4 Claims, 2 Drawing Sheets

METHOD FOR A DOUBLESIDED COATING OF OPTICAL SUBSTRATES

FIELD AND BACKGROUND OF THE INVENTION

The present invention relates to a method for producing optical coatings by means of plasma polymerization deposition in addition to thermically evaporated coatings. Such coatings are mainly used in the field of ophtalmics where they are exposed to especially hard environmental conditions. Coatings, such as anti-reflecting coatings therefore must adhere very well to the base. It is known that the substrate must be etched or provided with a layer which functions as an adherence interface before the thermically evaporated layer or layer system with optical effects is brought onto the base. The mentioned adhesive layer may not interfere with the optical characteristics of the layer system or the lens. It must be especially transparent. This adhesive layer is especially important when used for coating plastic substrates.

It is known that such coatings are produced by depositing them with a glow discharge by means of polymerisable gases. Among experts this is known as glow discharge polymerization or plasmapolymerization. U.S. Pat No. 3,713,869 teaches that an intermideate layer used as adherence agent is deposited on a PMMA plastic substrate and then coated with a hard inorganic layer. T. Wydeven and R. Kubacki in their article "Antireflection coating prepared by plasma polymerization of perfluorobutene-2" (Applied Optics, Volume 15, No. 1, January 1976) describe a method for producing an anti-reflection layer by using the plasma polymerization-method. It is also said that the plasma polymerization can take place simultaneously on both sides of the substrate. The German application DE 22 63 480 discloses a plasma polymerization method where the coating is meant to be a protective coating being scratch-resistent and water-repelling.

SUMMARY OF THE INVENTION

The present invention suggests a method and an arrangement which makes it possible to coat substrates on both sides with plasma polymerization layers and thermically evaporated optical layers which ensure a high life cycle of the coating together with a high economical industrial manufacturing process.

The invention is based on the knowledge that the use of an adhesive layer produced by plasma polymerization is advantageous for the layer to be evaporated afterwards. The thermical evaporation of optical layers is known to be produced within vacuum coating apparatus where the substrate holder is often dome-shaped due to the required high uniformity on the entire substrate and where the substrate holder is turned simultaneously during the evaporation procedure. Such evaporation apparatus are for instance described in H.K. Pulker's "Coatings on glass", Elsevier Publishing Company, 1984, page 213. Optical glasses, such as spectacle glasses, must however be coated on both sides. With apparatus equipped with usual glow electrodes the processing has to take place on one side first and then, after the substrate was turned, the processing can take place on the back side. When processed as described, the quality of the coating brought onto the substrate after it was turned is not the same as of the first coating. The coating on the back side can show cracks, can easily be rubbed away or even separate which makes the coating useless. It was found that with the first plasma processing, the back side of the substrate is untolerably contaminated. To prevent this, the back side would have to be completely covered during the processing of the front side. It is obvious that with commercial manufacturing methodes, this leads to high costs and efforts. The problem can be solved by proceeding according to the present invention. The plasma polymerization coating must be deposited at the same time and symmetrically on the front and the back side of the substrate. The simultaneous deposition on both sides of the substrate leads to the wanted coating quality with, at the same time, high process economy. The front side is then coated by thermal evaporation, the apparatus is vented and opened, the substrate is turned, and the apparatus is evacuated again in order to coat the back side.

According to another feature of the invention which calls for turning the substrate in the vacuum chamber process economy can be drastically enhanced. The process security is also importantly enhanced. The opening of the apparatus, the manipulation on the substrate holder and the following evacuation of the apparatus to proceed with evaporate the next layers are eliminated. This is very time consuming and can jeopardize the economical processing of the method. An opening of the apparatus between the evaporation steps can also cause a modification of the process conditions as well as generate contamination and particles. The interruption of the process and the opening of the apparatus thus, apart from economical disadvantages, also has disadvantages relating to the coatings' quality. One very advantageous method to avoid the problem consists of using a substrate holder which can be automatically turned after the plasma polymerization process and the coating of the first side took place without interrupting the vacuum in order to subsequently coat the substrate on the back side by means of thermal evaporation.

Several optical applications require a so-called multiple layer system. Such a multiple layer system can consist of the following layers, e.g: first, a polymerisat layer is deposited on the substrate, followed by a first evaporated layer consisting of one specific material, if needed followed by other evaporated layers consisting of e.g. different materials. With difficult combinations of evaporated layers it can also be advantageous to deposit a futher intermediate layer from a polymerisat as adhesive layer. With certain applications it is also advantageous to produce a polymerisat layer as covering layer. In this case, polymerisat layers with water-repelling effect and which cannot be rubbed away are being used as protective layers. Multiple layers of this kind are preferably produced according to the procedure as of claim 3 or 4.

The procedure and the use of the materials according to claim 5 are mostly suitable for the deposition of the plasma polymerized layer. As a reactive gas are used monomers such as organic substances like aromatic or aliphatic hydrocarbons or metallorganic substances or compounds such as of silicium organic substances.

According to the procedure as of claim 6, the plasma discharge is added additional supporting processing gases for the polymerization besides the reactive gas. The most suitable gases herefor are oxygen, argon or even air. With this additive it is possible to adjust the wanted chemical composition of the product of the reaction.

Further, by using the procedure according to the invention it becomes possible to influence the procedure relating to its deposition speed and the composition of the layer by means of magnetic fields for influencing and/or enhancing the plasma density. Such magnetic fields can be generated by means of electro magnetic or permanent magnets. These magnetic field generating means can either be placed within the plasma reactor or outside of it. An appropriate effect is reached when the magnetic flow density in the sphere of action near the electrodes and the substrate show values between 50 and 500 Gaus. This procedure according to the invention is described in claim 7.

By proceeding according to the procedure described in claim 8 of the invention, especially favourable results are reached in the field of ophtalmic optics. The optical coating of spectacle lenses has to meet high requirements relating to adhesive durity, durability and optical uniformity.

The successful commercial realization of the method requires an apparatus configuration which is carefully designed for these purposes. A coating apparatus of this kind with a high throughput must be designed economically relating to its cost and at the same time it must enable high layer qualities. It is recognized that the procedure according to the invention used in a commonly used vacuum coating apparatus can be realized without huge additional efforts, simply by adding the process specific elements of the invention. The high layer qualities without polymerisat layer required until today, up to now were produced by evaporating on a turning substrate holder to produce uniform layer thicknesses. The enhancement of the apparatus with rod-shaped or flat glow electrodes as well on the back and the front side of the turning substrate holders makes possible the simultaneous processing of the polymerisat deposition method according to the invention on both sides of the substrate holder. It also makes possible the deposition of evaporated layers during a subsequent step of the process. It is surprisingly that the plasma polymerization layer can be deposited sufficiently uniform and with a very good film quality inspite of the unsymmetrical shapes of the substrates and the substrate holders, and inspite of restricted space on the side of the substrate holder turned towards the vacuum wall. When proceeding with the realization of the arrangement according to claim 9 it is possible to realize the method according to the invention.

The plasma polymerization procedure and the evaporation procedure taking place immediately after it, are run on the same substrate holder in the same vacuum chamber. As the whole arrangement is marked by its simplicity, during the evaporation process the electrodes are not removed by a manipulation mechanism for economical reasons. During the evaporation, the part of the electrode which is exposed towards the source of evaporation is coated. The coating material which is deposited on the electrode will thus be lost for the substrate holder area and thus for the substrates placed on them. This will diminish the coating rate during the evaporation process. If rather slim rod-shaped electrodes are used, the losses can be neglected, with electrodes of larger surface, the losses increase due to the screening effect of the substrates which can make the procedure uneconomical. With larger electrode surfaces, however, the polymerisation procedure can take place with a higher rate. An optimum for the dimensioning of the covered electrode surface's size has to be found. It was found that good results can be reached if the proceeding takes place according to claim 11. A surface coverage of some percent of the substrate holder by the electrodes leads to good results whereas surface coverages of more than 50% cannot be tolerated economically although the quality of the coating would be sufficiently good.

Especially good results are reached with the plasma polymerisation procedure if the electrodes and the supply lines are shielded according to the procedure claimed in claim 12. According to the invention, the extension of the plasma, shall be strictly limited to the substrate holder. The supply lines shall be completely isolated and shielded, whereas the electrodes shall only be isolated and/or covered on the side turned away from the substrate holder. The procedure according to claim 12 considerably increases both the deposition rate of the polymerization coating and the reproducability and in many cases is decisive for the applicability of the procedure.

BRIEF DESCRIPTION OF THE DRAWING

The invention shall now be explained by means of the figures wherein.

DESCRIPTION OF THE PREFERRED EMBODIMENTS

Figure 1:
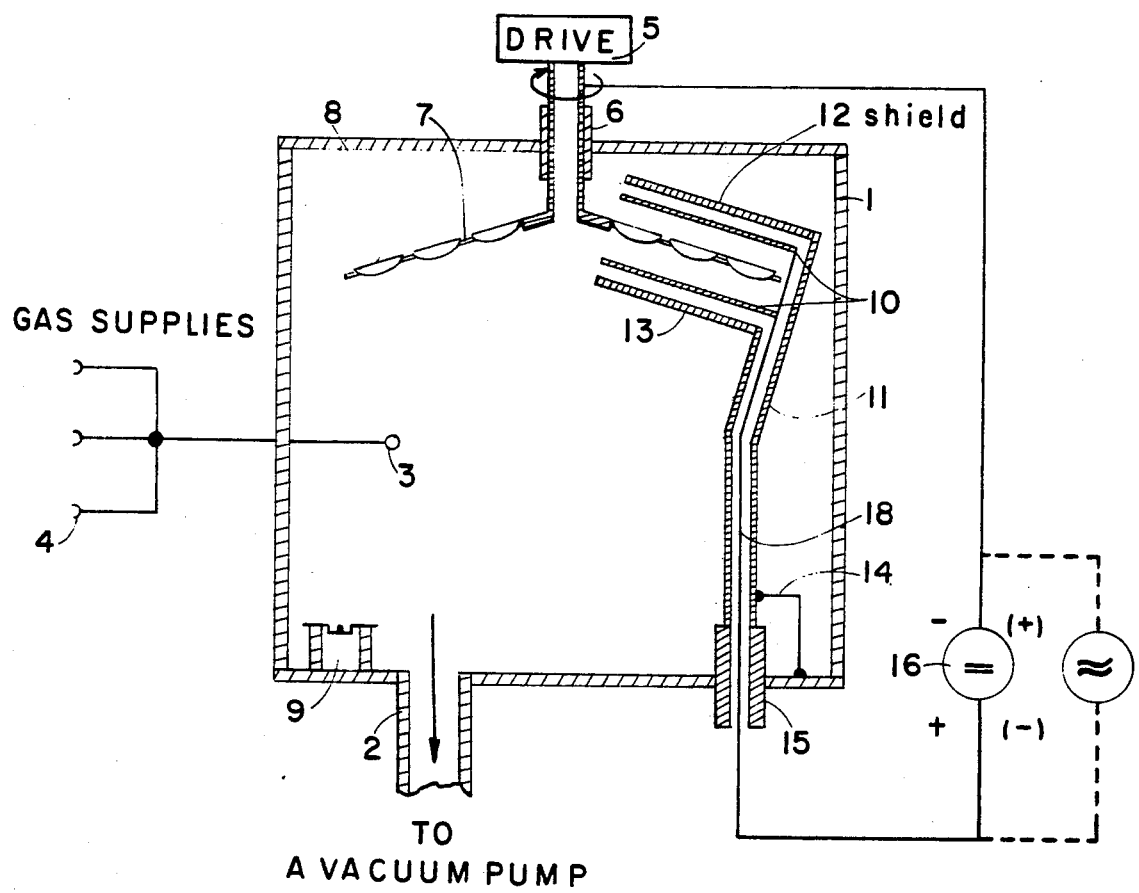
FIG. 1 is a schematic and sectional view of the processing chamber for a plasma polymerization procedure and an evaporation procedure.

FIG. 1 is a schematic sectional view of the processing chamber 1 for the production of evaporated coatings. The chamber 1 is linked to a vacuum pump by means of a connection piece 2. During the processes, the substrate holder 7 which can be for example plate shaped, dome shaped or cone shaped is turned by means of the drive 5 coupled by a rotary motion feed through 6. The substrates 8, such as optical lenses, especially plastic lenses are carried by the substrate holder 7. The shown cone-shaped substrate holder 7 has openings to take the substrates 8 so that the substrates 8 are accessable from both sides for the deposition procedure. So-called turning arrangements are preferably used as substrate holders. These often segment-shaped divided substrate holders then can be turned for the coating of the back side by means of the turning mechanism. The coating of the substrates 8 is done as known by means of the evaporation sources 9 which are placed at a certain distance opposite the substrate holder 7. To produce uniform coatings it is usual to use evaporation geometries where the substrate holder 7, as mentioned, is turned during the coating process by means of the drive 5. Thermal evaporators such as electron beam evaporation sources or so-called boat evaporators are especially suitable as evaporation sources 9. As it is known, gases can be let in to support the composition of the deposited layer by means of a gas inlet or a distribution device 3 in order to support the evaporation procedure. The addition of one or more gases is done by means of the connection pieces 4. The process gases, such as monomers and auxiliary gases for the plasma polymerization procedure are let in by these gas inlets 3 and 4. The process gas pressures range between 1 millibar through $10^{-4}$ millibar, according to the desired process conditions. To proceed according to the invention, electrodes 10 are used which partly covers the electrically conductive substrate holder 7 on both sides and which are linked to electric supplies 16, 17 by means of supply lines 18 and by means of an insulated current feed through 15. The electrodes 10 are placed so that they reach from the margin or periphery of the substrate holder 7 almost to its center of rotation. By turning the substrate holder 7 the electrodes 10 ensure that the plasma discharge taking place between each electrode 10 and the substrate holder 7 functioning as a counter electrode, evenly passes over the substrates 8. The distance between the electrodes should range between 1 through 20 cm. Economical process results of good quality are reached if the electrode 10 is exclusively exposed towards the substrate holder 7. For this purpose, the electrode 10 is provided with a dark space shielding 12, 13 on the side turned away from the substrate holder 7. For example this dark space shield forms a potential surface which is electrically connected with ground potential or with the potential of the processing chamber and wherein this potential surface holds a certain defined distance in relation to the electrodes 10 for forming in a well known way the function of a dark space shield. Thus the choosen distance depends depending on the working pressure used. With the present procedure, the distances range within some millimeters. The supply line 18 to the electrodes is completely shielded by means of a dark space shielding 11. Instead of such space shielding it is possible to use insulators such as ceramics.

To produce a plasma discharge, the electrode 10 is supplied with an electric voltage of the generators 16, 17. When using a DC-supply 16, the voltages which are possible range between 200 Volts through 5000 Volts. The polarity of the connected electrode 10 can be negative or positive, depending on the effect wanted for the structure of the deposited polymerisat coating on the substrate holder 7. The substrate holder is usually electrically connected to the wall of the chamber. It is known that the same arrangement can also by used to proceed with an ion etching by means of a pure rare gas discharge before proceeding with the plasma polymerization deposition. In this case it is possible depending on the choice, to etch the substrate when negative polarity is applied to the substrate holder. When positive polarity is applied to the substrate holder, the substrate is coated with a small amount of electrode material. Afterwards the plasma polymerization process can take place without interrupting the process by adding the corresponding process gases. Instead of generating a direct voltage discharge it is also possible to generate an alternating voltage discharge. In this case, the electrode 10 is fed by an alternating current or radio frequency generator 17. To proceed according to the invention, frequencies of 50 Hertz through to some Megahertz are suitable. The electrode 10, in relation to the substrate holder, can be designed as two electrically separated parts which are supplied separately by two supplies which makes it possible to finely tune the process by adjusting the electric parameters. In this case it can be preferable to place the substrate holder in an isolated location opposite to the chamber 1 and to operate with a so-called bias operation by means of a separate supply placed opposite the electrodes 10 and the vacuum chamber 1.

The effectiveness of the method can be further increased by using magnetic fields in the area of the plasma discharge which increases the plasma density and thus also increases the deposition rate. The use of magnetic fields can also be advantageous as it lowers the discharge voltage, which considerably simplifies the electrode installation and allows the use of more economical supplies. Favourable results are reached if permanent magnets are used which are placed in the area of the electrodes and if a magnetic flow density of 50 through 500 gauss is reached in the discharge area between the electrode 10 and the substrate 7. With such arrangements, discharge voltages from 200 through 1500 volts are possible. The magnetic fields can of course also be generated by means of electro magnetic coils.

Figure 2:
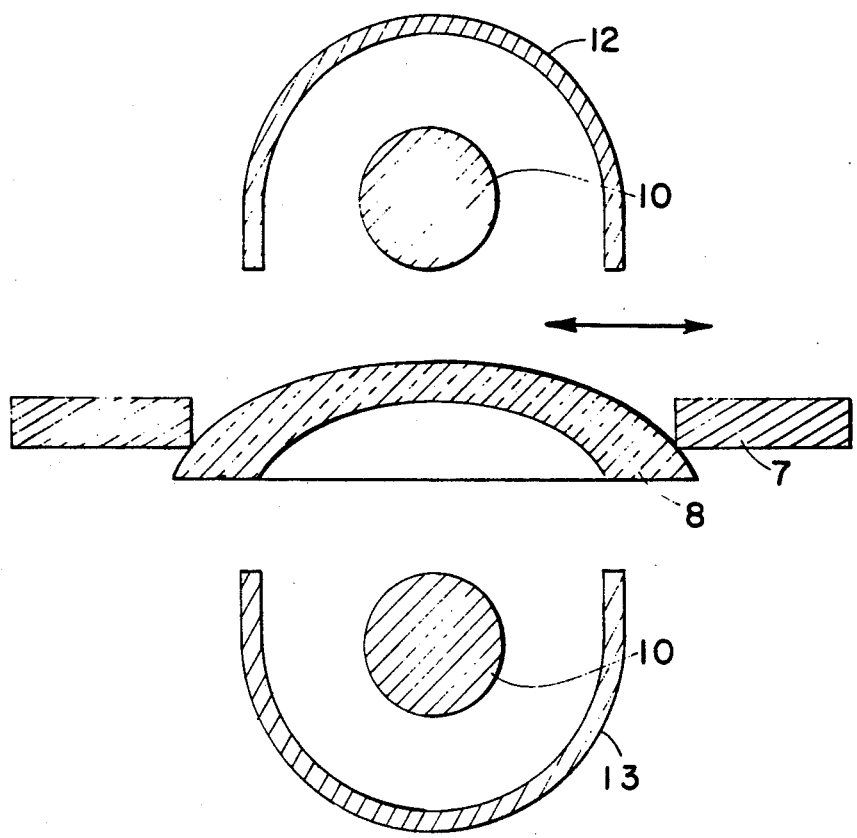
FIG. 2 is a sectional view of a rod-shaped electrode placed on both sides of the substrate holder with dark space shieldings.

FIG. 2 is a sectional view of a preferred design of the electrode 10, the dark space shields 12 and 13 and the substrate holder 7 with a substrate 8. The rod-shaped electrode 10 with a diameter of e.g. 10 mm is placed opposite to the substrate holder 7 within a distance of some centimeters, and the dark space shields 12 and 13 surround the electrode 10 on the side turned away from the substrate holder. The discharge thus is concentrated between the electrode 10 and the substrate holder 7. On the one hand, the homogenity of the deposition procedure can be improved and on the other hand, it prevents unacceptable contamination which might be deposited with extended plasma discharge.

Figure 3:
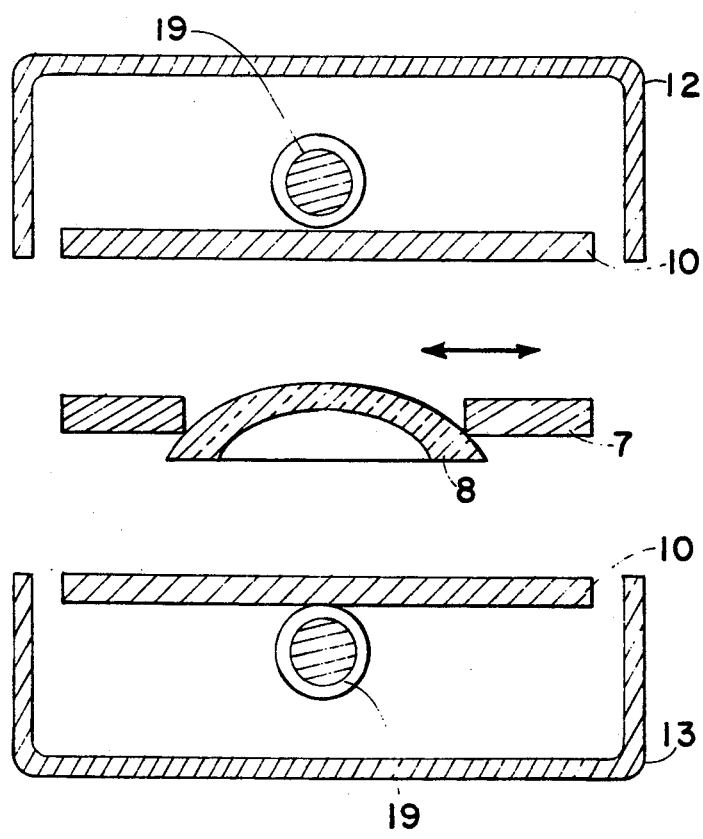
FIG. 3 is a sectional view of a flat electrode placed on both sides of the substrate holder with dark space shieldings.

In some cases a flat electrode 10 can be advantageous compared to rod-shaped electrodes. The use of a large surface electrode 10 is preferred, especially in cases where the thickness of the polymerization layer is dominating compared to the layers evaporated during the entire procedure. FIG. 3 is a sectional view of a large surface electrode arrangement where the same reference numerals are used to designate the same or similar parts.

With the arrangement according to the invention, a more than 50% surface coverage of the substrate holder 7 by the electrode 10 is usually not economical. With large surface electrode arrangements as the one of FIG. 3 it can become necessary with increased operating performance to avoid the losses by means of cooling devices 19.

EXAMPLE 1

A lacquered and a non lacquered CR 39 lens where coated within a coating apparatus as described in FIG. 1 with a plasma polymerized layer combination and then coated on both sides with an evaporated anti reflection coating. To deposit the adhesive layer, a 12 mm rod-shaped electrode according to the invention was used; the distance between the substrate and the electrode was 4 cm. The process steps were the following:

Evacuation of the apparatus up to $1 \times 10^{-4}$ mbar.

Filling the apparatus with dimethyldiaethoxysilane up to a pressure of $1 \times 10^{-1}$ mbar.

Switch on the DC generator with a voltage of 4.2 kV and 160 mA discharge current during a 60 seconds period for the plasma discharge.

Evacuation of the apparatus up to $1 \times 10^{-4}$ mbar.

Filling the apparatus with dimethyldiaethoxysilane up to a pressure of $5 \times 10^{-2}$ mbar and subsequently filled up with oxygen through to a pressure of $1 \times 10^{-1}$ mbar.

Putting on a DC-Voltage of 4 kV and a 140 mA discharge voltage during a 60 seconds period.

After these process steps for the deposition of the polymerization coating the lens was coated with an antireflection coating without interrupting the vacuum. The antireflection coating process consisted of evaporating 4 layers with the following sequence: $TiO_2$, $SiO_2$, $TiO_2$, $SiO_2$. The antireflection coating of the second lens side was made the same way after the lens had been turned by means of an automatic turning mechanism. The same procedure can also be successfully run when the lenses—after the first side was coated with an antireflection coating—are turned manually after the apparatus was opened in order to coat the other side.

The lenses had to undergo a durability test, i.e. they were submerged 6 times during 2 minutes in a boiling watery 4.5% NaCl solution and then in 20° C. water. The coatings showed no visible damages, such as cracks or separations.

EXAMPLE 2

With this test, the plasma polymerization layer and the anti reflection layer were first deposited on one side of the lens and then on the other side of it. According to the state of the art, a simple rod-shaped electrode was used to deposit the polymerization layer. The anti reflection layer was evaporated subsequently. The lens then was turned to deposit the other polymerization layer and subsequently the anti reflection layer on the back side of the lens.

The lens was tested the same way as described in example 1. The side of the lens which was coated first showed the same durability as the lens sides coated according to example 1. The second side of the lens which was coated after the lens had been turned showed considerable layer detachements after a first test cycle already, i.e. after it had been submerged once in a watery 4.5% NaCl solution. The back side of the lens thus had a coating unfit for use. To produce an adhesive double sided coating of the lenses according to the state of the art in the present commonly used apparatus configuration thus does not furnish useful results. To produce adhesive coatings on both sides of a lens according to the state of the art method would only be possible if one side of the lens was covered during the coating of the other side of the lens. Such a procedure would require that the back side of the lens is carefully covered and thus undesired contamination is prevented. One possibility consists of opening the apparatus after the first side was coated, then removing the coverage and turning the lens in order to be able to coat the other side. Another possibility is to use a complex automatically movable coverage handling device which must be operated every time before the substrates are turned. This procedure or apparatus is economically not tolerable and the quality of the products is reduced due to complicated manipulations.

EXAMPLE 3

A CR 39 lens was covered with an antireflection coating as described in example 1. After the coating of the back side of the lens the following steps were made without interrupting the vacuum:

The apparatus was filled with dimethyldiaethoxysilane up to a pressure of $1.10^{-1}$ mbar.

For the plasma discharge the DC generator was switched on with a voltage of 4.2 kV and 160 mA discharge current during a 60 seconds period.

Both sides of the lens showed a heavily hydrophobic behavior. As a result the lens could be cleaned more easily. The lens then was tested as described in the first example. The coating showed no visible damage, such as cracks or layer separations.

What is claimed is:

1. An arrangement for coating at least one substrate, comprising:
   a vacuum chamber having an inlet for gas and an outlet from which a vacuum can be drawn;
   gas supply means connected to the gas inlet for supplying selected gases to the vacuum chamber;
   vacuum means connected to the vacuum inlet for drawing the vacuum in the vacuum chamber;
   an electrically conductive substrate holder mounted for rotation around an axis in the vacuum chamber and having opposite sides;
   at least one glow electrode in the vacuum chamber at a location with respect to the axis for facing both sides of the substrate holder for at least partly covering both sides of the substrate holder; and
   at least one thermal evaporation source in the vacuum chamber for supplying a thermally evaporated material for deposit on a substrate held by the substrate holder.

2. An arrangement according to claim 1, including a monomer in the gas means for discharge into the vacuum chamber, and a power supply connected to the glow electrode for producing a plasma polymerized layer from the monomer which is deposited on both sides of a substrate held by the substrate holder.

3. An arrangement according to claim 1, wherein the glow electrode covers not more than approximately one-half of the area on both sides of the substrate holder.

4. An arrangement according to claim 1, including an electrical supply line extending into the vacuum chamber and connected to the glow electrode, and dark space shields around the supply line and on the side of the electrode turned away from the substrate for shielding the supply line and electrode with respect to the vacuum chamber.

* * * * *